United States Patent [19]

Heinzl

[11] 3,968,386

[45] July 6, 1976

[54] ARRANGEMENT FOR ACTUATING DOT-PRODUCING PRINTING ELEMENTS OF A MOSAIC PRINTING HEAD

[75] Inventor: Joachim Heinzl, Munich, Germany

[73] Assignee: Siemens Aktiengesellschaft, Berlin & Munich, Germany

[22] Filed: Aug. 5, 1974

[21] Appl. No.: 494,707

[30] Foreign Application Priority Data

Aug. 31, 1973 Germany ........................... 2344065

[52] U.S. Cl. ................................ 310/8.1; 310/8.3; 318/116; 346/141

[51] Int. Cl.[2] ........................................ H01L 41/08

[58] Field of Search ............... 310/8.1, 8.3, 8.2, 8.7; 346/141; 101/93 R; 318/116, 118

[56] References Cited

UNITED STATES PATENTS

| | | | |
|---|---|---|---|
| 2,400,953 | 5/1946 | Roys | 346/141 X |
| 3,418,427 | 12/1968 | Jones | 346/141 X |
| 3,473,466 | 10/1969 | Thayer | 310/8.1 X |
| 3,819,961 | 6/1974 | Prudent | 310/8.1 |
| 3,821,747 | 6/1974 | Mason | 346/139 R |
| 3,828,357 | 8/1974 | Koeblitz | 310/8.1 X |
| 3,840,758 | 10/1974 | Zoltan | 310/8.1 |

*Primary Examiner*—Mark O. Budd
*Attorney, Agent, or Firm*—Hill, Gross, Simpson, Van Santen, Steadman, Chiara & Simpson

[57] ABSTRACT

An arrangement for actuating dot-producing printing elements of a mosaic printing head, employing piezoelectric transducers which may be set in elongated and contracted states by the application of a suitable electric field, by means of which the printing elements, on transition from one state to the other state, are actuated, whereby as a result of their own mass inertia they are moved toward the printing position and subsequently return into their initial position, comprising an actuating circuit for each piezoelectric transducer which has controlled circuit elements operative to effect an elongation of the transducer, and circuit elements which are controlled in dependence upon the return of the operated dot-producing printing element to the piezoelectric transducer, operative to control the operation of such piezoelectric transducer.

6 Claims, 2 Drawing Figures

ARRANGEMENT FOR ACTUATING DOT-PRODUCING PRINTING ELEMENTS OF A MOSAIC PRINTING HEAD

BACKGROUND OF THE INVENTION

The invention is directed to an arrangement for actuating dot-producing printing elements of a mosaic printing head, employing piezoelectric transducers which may be set in elongated or contracted states upon the application of suitable electric fields by means of electrical circuit arrangements, whereby, on the transition from the contracted state into the elongated state, the dot-producing printing elements are accelerated and the dot-producing printing element associated therewith, as a result of its own mass inertia, is moved towards the printing position. Subsequently, as a result of resetting energy (rebound and spring energy), the dot-producing element is returned from the printing position into its initial position.

It is generally known to operate individual dot-producing printing elements of mosaic printing heads by means of electromagnet systems. It has also been proposed to employ piezoelectric transducers for operation of such dot-producing printing elements, with the mosaic printing heads being so designed that the ends of the dot-producing printing elements, remote from the printing position, are urged by spring elements against flat, elongated piezoelectric transducers. In such case, the spring elements are so dimensioned that the applied spring forces are considerably lower than the forces acting upon the dot-producing printing elements during the elongation of the piezoelectric transducers, as a result of corresponding changes in the electric fields applied to the latter. In a mosaic printing head of such design, the advantages derived are that the drive means, i.e. the piezoelectric transducers can be arranged in very close relation and thus staggered or spaced in accordance with the pattern of the dot-producing printing elements. The overall dimensions of the printing head are thereby considerably reduced in comparison to conventional magnet drive means for dot-producing printing elements, and thus a corresponding reduction is achieved in the space required for the arrangement, as well as in the masses which are to be moved, accelerated and decelerated, and thus of the type carrier carriage which moves along the printing line during the printing operation.

In all printing operations in which the printing elements travel in free flight to the printing position, a fundamental difficulty exists with respect to the return of the printing elements, away from the printing position, into their initial position with the least possible vibration, in order to be available for the next operating sequence. It will be apparent that the more rapidly each printing element returns from the printing position into its initial rest position, the more quickly the next printing cycle can be initiated. Consequently, by shortening the vibration time, it is possible to considerably increase the printing speed.

BRIEF SUMMARY OF THE INVENTION

The present invention therefore has as its objective, the improvement of an arrangement for operating dot-producing printing elements of a mosaic printing head, employing piezoelectric transducers, by the employment of effective measures to suppress vibration of the dot-producing printing elements returning from the printing position into their initial position.

These requirements may be met by a circuit arrangement which not only includes means to supply a piezoelectric transducer with the necessary fields for elongating the latter, but also circuit elements which are controlled in dependence upon the return of the operated dot-producing element upon the piezoelectric transducer and which are operative to effect a contraction of such transducer.

In an arrangement according to the invention, embodying these features, the return of the dot-producing printing element to the piezoelectric transducer is monitored and a contraction of the piezoelectric transducer is effected during this phase whereby the dot-producing printing element is returned to the piezoelectric transducer without vibration. The next actuation of the dot-producing printing element can thereby be immediately initiated, i.e. acceleration of such dot-producing printing element may be effected by the associated piezoelectric transducer.

In accordance with a preferred embodiment of the invention, the piezoelectric transducer is operatively connected to a measuring circuit which electrically registers the rebound of the actuated dot-producing printing element returning to its rest position on the piezoelectric transducer, with such circuit suitably controlling the circuitry, effecting contraction of the piezoelectric transducer, in dependence upon a registered rebound pulse.

In such arrangement, the piezoelectric transducer is employed to produce mechanical movements by means of appropriately applied electric fields. In accordance with the preferred embodiment of the invention, there is additionally exploited the fact that as a result of mechanical changes in the piezoelectric transducer electric fields are created so that in the event of such mechanical changes in the piezoelectric transducer, corresponding voltages may be derived across the electrodes thereof. Such mechanical changes in the piezoelectric transducer occur when the dot-producing printing element, returning from the printing position, strikes the piezoelectric transducer. The electric pulse thus registered is analyzed and processed for activating the circuit elements to apply an electric field which effects a contraction of the piezoelectric transducer.

In accordance with a further development of the preferred embodiment of the invention, the measuring circuit may be connected in series with the piezoelectric transducer, and may comprise a capacitive element, a resistor and a switching unit which is current transmissive in opposition to the direction of the voltage field which forms during the mechanical compression of the piezoelectric transducer, and which in the direction of the voltage drop occurring on the mechanical compression of the piezoelectric transducer opposes a blocking potential which virtually corresponds to the value of the voltage drop produced by the mechanical compression. Connected in parallel to such switching unit is a resistance element at which it is possible to derive the desired value for triggering the switching element producing the contraction of the piezoelectric transducer. A Zener diode, preferably connected in parallel with the resistance element, may be employed as a switching unit.

It is also expedient to employ a circuit so designed, in order to effectively recognize the electrical pulse occurring when the dot-producing printing element strikes the piezoelectric transducer, as well as to prevent high voltages, resulting from the mechanical movements of the piezoelectric transducer from destroying the measuring circuit.

At the instant at which the dot-producing printing element leaves the piezoelectric transducer, following the acceleration phase, to travel on to the printing position, mechanical vibrations occur in the piezoelectric transducer which also result in oscillations in the applied electric voltage. The danger exists that such oscillations may cause a simulation of the striking of the dot-producing printing element, returning from the striking position, upon the piezoelectric transducer. To prevent this situation, the preferred embodiment of the invention preferably further includes a time-controlled blocking element which is operatively connected to the measuring circuit associated with the piezoelectric transducer. Such time-controlled blocking element is so designed that the measuring circuit connected to the piezoelectric transducer is inoperative until shortly prior to the instant at which the dot-producing printing element, in its return from the printing position, strikes the piezoelectric transducer.

In accordance with another preferred embodiment of the invention, the circuit elements employed to effect elongation and contraction of the piezoelectric transducer are connected to a time-controlled switching unit which, for the elongation and contraction phases, activates the relevant circuit elements for the switch-through of the requisite potential, and between operative phases blocks such circuit elements from effecting a shift in potential between the poles of the piezoelectric transducer. As a result of this arrangement, the mechanical vibrations occurring in the piezoelectric transducer, following the elongation and contraction phases of the latter, are quickly damped.

Normally the piezoelectric transducer reacts to the sudden change in the applied electric field with an almost undamped oscillation in its natural frequency. During such oscillations, constantly changing forces arise in the piezoelectric transducer and are converted thereby into charges. As long as the drive means impresses an electric field upon the piezoelectric transducer, such charges immediately flow off. If in accordance with a preferred further development of the invention, such charges are prevented from flowing away, they will be operable to produce opposing forces which counteract the oscillations and thus damp the piezoelectric transducer.

BRIEF DESCRIPTION OF THE DRAWINGS

In the drawings wherein like reference characters indicate like or corresponding parts.

DETAILED DESCRIPTION OF THE INVENTION

Figure 1:
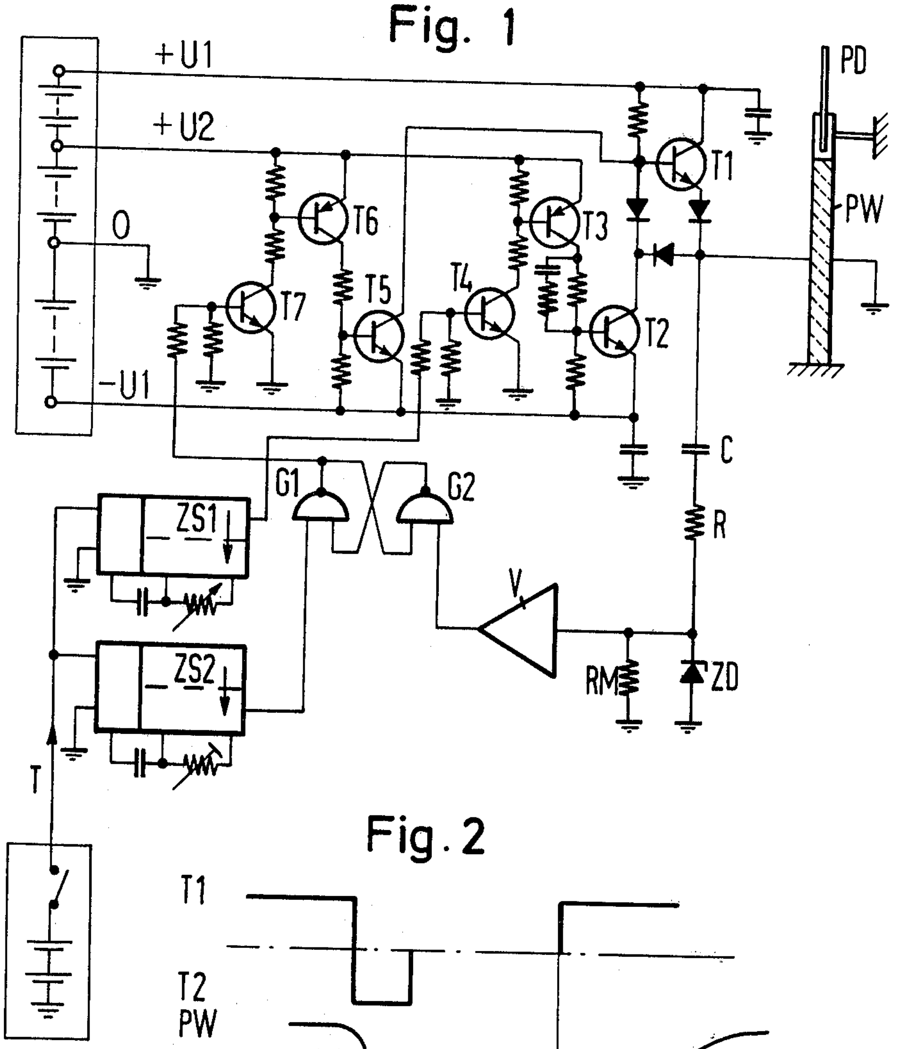
FIG. 1 illustrates a circuit arrangement for controlling a piezoelectric transducer in accordance with a monitoring circuit.

The supply voltages which are adapted to provide the electric fields necessary for the contraction and elongation of a piezoelectric transducer are adapted to be supplied between the terminals +U1 and 0, and between –U1 and 0. If, in the initial state of the circuit, a control voltage is connected neither to the base of the transistor T7, nor to the base of the transistor T4, both transistors will be blocked, and thus transistors T3, T2 and transistors T6, T5 will also be blocked. Consequently, only transistor T1 will be conductive over its collector-base resistance so that positive voltage U1 is connected to the electrodes of the piezoelectric transducer PW. Such voltage thus functions to maintain the piezoelectric transducer in its longitudinal contracted state.

In order to maintain this state of the circuit, no control voltage can be applied from the time-controlled switching unit ZS1 nor from the output of the gate G1. The time-controlled switching unit ZS1 is a monostable trigger stage which supplies the transistor T4 with a drive voltage only upon the arrival of a control pulse train over the control line T, with such voltage being applied for a length of time required to effect a transition of the piezoelectric transducer PW from its contracted state into its elongated state by a change in the applied voltage from +U1 to –U1.

By means of a time-controlled blocking element ZS2, likewise in the form of a monostable flip flop, a potential 1 is applied to one input to the gate G1 and as a potential 1 is simultaneously applied to the gate G2 from the amplifier V in the rest state. The second input of the gate G1 is supplied with a potential 1 from the negated output of the gate G2, so that the required potential 0 is applied to the negated output of the gate G1.

On the arrival of a timing pulse over the pulse train line T, the base of transistor T4 is supplied, over the time-controlled switching unit ZS1, with a control potential, which is operative over a transistor T3 to render transistor T2 conductive and thus transistor T1 blocked. The piezoelectric transducer PW thus is supplied with the negative voltage –U1 resulting in an elongation of the transducer and acceleration of the dot-producing printing element PD in the direction towards the printing position.

At the same time, potential 0 is applied over the time-control blocking element ZS2 to the input of the gate G1, whereby the transistor T7, T6 and transistor T5 are rendered conductive, as a result of which the transistor T1 is blocked over transistor T5. If the piezoelectric transducer has reached its elongated state and the dot-producing printing element PD has accelerated in the direction towards the printing position, the drive potential for the base of transistor T4 is disconnected by operation of time control switching unit ZS1, as a result of which the transistor T2 is blocked over transistor T4 and transistor T3. However, since the transistor T1 remains blocked over transistor T5, the piezoelectric transducer is not subjected to any electric fields produced by further supplied voltages. The existing charges and those produced by mechanical vibration of the piezoelectric transducer across the electrodes of the transducer are thus unable to flow off. The oscillations which occur, following the rapid elongation of the piezoelectric transducer PW, consequently rapidly die away.

As 0 potential continues to remain at the input of the gate G1, which is controlled by the time-controlled blocking element ZS2, the inverted output of the gate G1 remains at the potential which drives transistor T7 conductive, irrespective of which potential is supplied by the amplifier V to the input of the gate G2.

Shortly prior to the instant at which the dot-producing printing element PD, returning from the printing position, strikes the piezoelectric transducer PW, a 1 potential is supplied over the time-control blocking element ZS2 (designed as a monostable trigger stage), to the associated input of the gate G1. A 0 potential continues to be applied from the inverted output of the gate G2 to the other input of gate G1 whereby the output of the latter retains potential enabling transistor T7. If the gate G2 is supplied by the amplifier V with a 0 potential, as is the case when the dot-producing printing element returning from the printing position strikes the piezoelectric transducer a 1 potential arises at the inverted output of gate G2 whereby 1 potential occurs at the two inputs of the gate G1, and thus a 0 potential occurs at the inverted output of the gate G1 which blocks the transistor T7. Consequently, transistor T1 again becomes conductive, and as a result of the positive voltage +U1 supplied to the piezoelectric transducer, the latter is again subjected to an electric field operative to contract it.

In order to register and analyze the striking of the returning dot-producing printing element PD upon the piezoelectric transducer, a measuring circuit is provided, employing a serially connected capacitor element C, a resistor R and a Zener diode ZD, to which a measuring resistor RM is connected in parallel. The Zener diode ZD is so connected and dimensioned that, at a voltage applied to the piezoelectric transducer PW creating an electric field which effects a contraction of such transducer, no voltage drops occur across the measuring resistor RM. However, when the applied voltages to the transducer PW create an electric field resulting in elongation of the transducer, and which occur when the latter is contracted by impact upon said transducer of the dot-producing printing element, returning from the printing position, are opposed by the Zener diode ZD with a blocking potential which is approximately equal to the voltage produced in the piezoelectric transducer as a result of the impact of the dot-producing printing element. The voltage which occurs is thus supplied to the amplifier device V over the measuring resistor RM. The Zener diode ZD is provided in order to prevent the amplifier device V from being overloaded by increased current surges and voltages, and in order to achieve a sufficient degree of operational stability. The amplifier device V is so designed that upon arrival of a measuring pulse, the normally present 1 potential is changed to 0 potential.

Figure 2:
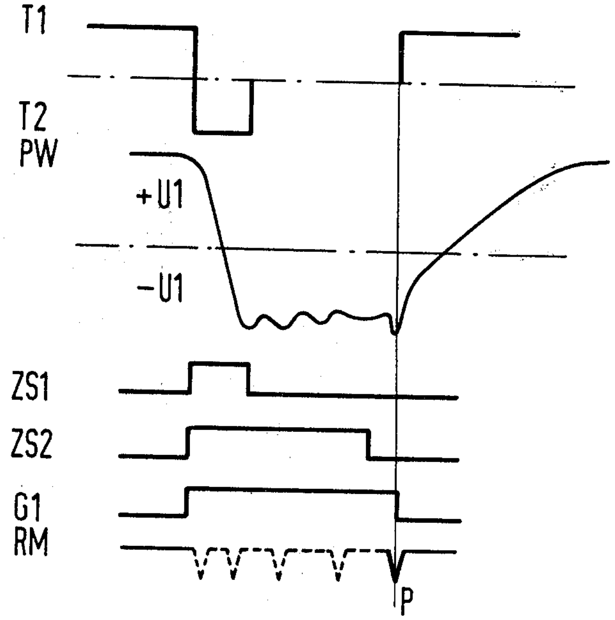
FIG. 2 represents pulse diagrams for various parts of the circuit illustrated in FIG. 1.

The pulse diagram illustrated in FIG. 2 represents the switching operation of the transistors T1 and T2, occurring in the operation of the circuit illustrated in FIG. 1, and the potentials which exist in each case at the output of the time controlled switching unit ZS1, the time controlled blocking circuit ZS2, the gate G1 and the measuring circuit over the measuring resistor RM.

At the time P, a control signal is received which signals the striking of the dot-producing printing element PD on the piezoelectric transducer PW, and as a result of the slightly preceding resetting of the time controlled blocking element ZS2, a further processing of such signal over the gates G2 and G1 is rendered possible and the transistor T1 is again driven so that the piezoelectric transducer PW is again brought into its contracted state by the electric field formed by the voltage then applied. The dot-producing printing element returning from the printing position onto the piezoelectric transducer thus is intercepted without vibration.

Having thus described my invention it will be obvious that although various minor modifications might be suggested by those versed in the art, it should be understood that I wish to embody within the scope of the patent granted hereon all such modifications as reasonably, and properly come within the scope of my contribution to the art.

I claim as my invention:

1. An arrangement for actuating dot-producing printing elements in a mosaic printing head utilizing piezoelectric transducers which may be set in either an elongated or a contracted state by the application of suitable electric fields over electrical circuit means, and by means of which the print producing printing elements on the transition from the contracted state into the elongated state are accelerated whereby, as a result of their own mass inertia, move towards the printing position, and are returned from the printing position, by rebound and spring resetting energy, into their initial position, comprising an actuating circuit for each piezoelectric transducer, which has controlled circuit elements operative to effect an elongation of the cooperable piezoelectric transducer, and circuit elements which are controlled, in dependence upon the return of the operated dot-producing printing element to the piezoelectric transducer, operative to contract such transducer.

2. An arrangement according to claim 1, wherein the piezoelectric transducer is connected to a measuring circuit operative to electrically register the striking of the operated dot-producing printing element, returning into its rest position, on the piezoelectric transducer, operative in dependence upon the registering of a striking pulse to actuate said circuit elements and effect a contraction of the piezoelectric transducer.

3. An arrangement according to claim 2, wherein the measuring circuit is connected in series with the piezoelectric transducer and comprises a capacitive element, a resistor, and switching means which, in opposition to the direction of the voltage drop occurring upon the mechanical compression of the piezoelectric transducer, is current conductive, and in the direction of the voltage drop occurring upon the mechanical contraction of the piezoelectric transducer, opposes a blocking potential which virtually corresponds to the value of the voltage drop produced by the mechanical contraction, and a resistance element connected in parallel with such switching circuit, over which may be derived the measured value for the triggering of said circuit elements effecting contraction of the piezoelectric transducer.

4. An arrangement according to claim 3, wherein the switching means comprises a Zener diode, connected in parallel with said resistance element, over which may be derived the measured value for the triggering of said circuit elements effecting contraction of the piezoelectric transducer.

5. An arrangement according to claim 2, wherein a time controlled blocking element is connected to the measuring circuit, operative to render the latter inoperative until just prior to impact of a returning printing element upon the cooperable piezoelectric transducer.

6. An arrangement according to claim 1, wherein the circuit elements operable to effect elongation and contraction of the piezoelectric transducer are connected to a time-controlled switching unit which, during the elongation and contraction phases, activates cooperable circuit elements for effecting supply of the requisite potential, and which between operative phases blocks such circuit elements to prevent a shift in potential between the poles of the piezoelectric transducer.

* * * * *